(12) United States Patent
Nishiki et al.

(10) Patent No.: US 9,716,183 B2
(45) Date of Patent: Jul. 25, 2017

(54) SEMICONDUCTOR DEVICE AND METHOD OF MANUFACTURING SAME

(71) Applicant: Sharp Kabushiki Kaisha, Sakai, Osaka (JP)

(72) Inventors: Hirohiko Nishiki, Sakai (JP); Akira Sasakura, Sakai (JP); Tohru Okabe, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/124,385

(22) PCT Filed: Mar. 10, 2015

(86) PCT No.: PCT/JP2015/057009
§ 371 (c)(1),
(2) Date: Sep. 8, 2016

(87) PCT Pub. No.: WO2015/137337
PCT Pub. Date: Sep. 17, 2015

(65) Prior Publication Data
US 2017/0018646 A1  Jan. 19, 2017

(30) Foreign Application Priority Data
Mar. 11, 2014  (JP) .................................. 2014-047608

(51) Int. Cl.
*H01L 29/786* (2006.01)
*H01L 29/417* (2006.01)
(Continued)

(52) U.S. Cl.
CPC .... *H01L 29/7869* (2013.01); *H01L 29/41733* (2013.01); *H01L 29/42384* (2013.01); *H01L 29/66969* (2013.01); *H01L 29/78696* (2013.01)

(58) Field of Classification Search
CPC ......... H01L 27/14609; H01L 27/14643; H01L 27/14603; H01L 27/14689;
(Continued)

(56) References Cited

U.S. PATENT DOCUMENTS 8,049,255 B2 * 11/2011 Sakai .................. H01L 27/1214
257/223
8,735,194 B2 * 5/2014 Takahashi ........... H01L 27/1225
257/67
2012/0138922 A1  6/2012 Yamazaki et al.

FOREIGN PATENT DOCUMENTS

JP   2011-009393 A   1/2011
JP   2012-134475 A   7/2012
WO  2009/034953 A1   3/2009

* cited by examiner

*Primary Examiner* — Quoc Hoang
(74) *Attorney, Agent, or Firm* — Keating & Bennett, LLP

(57) ABSTRACT

A semiconductor device includes a thin film transistor (100), the thin film transistor (100) including: a substrate (1); a gate electrode (3) provided on the substrate (1); a gate dielectric layer (5) formed on the gate electrode (3); an island-shaped oxide semiconductor layer (7) formed on the gate dielectric layer (5); a protective layer (9) provided so as to cover an upper face (7u) and an entire side face (7e) of the oxide semiconductor layer (7), the protective layer (9) having a single opening (9p) through which the upper face (7u) of the oxide semiconductor layer (7) is only partially exposed; and a source electrode (11) and a drain electrode (13) which are in contact with the oxide semiconductor layer (7) within the single opening (9p).

11 Claims, 8 Drawing Sheets

(51) Int. Cl.
*H01L 29/423* (2006.01)
*H01L 29/66* (2006.01)

(58) Field of Classification Search
CPC ......... H01L 21/823406; H01L 21/8234; H01L 21/00; H01L 21/775
See application file for complete search history.

(a)

(b)

(a)

(b)

(a)

(b)

US 9,716,183 B2

1

SEMICONDUCTOR DEVICE AND METHOD OF MANUFACTURING SAME

TECHNICAL FIELD

The present invention relates to a semiconductor device including thin film transistors, and a method of producing the same.

BACKGROUND ART

Active matrix substrates that are used for liquid crystal display devices or the like include a switching element for each pixel, e.g., a thin film transistor (hereinafter "TFT"). As such switching elements, TFTs whose active layer is an amorphous silicon film (hereinafter "amorphous silicon TFTs") and TFTs whose active layer is a polycrystalline silicon film (hereinafter "polycrystalline silicon TFTs") have been widely used.

In the recent years, it has been proposed to use an oxide semiconductor as the material of the active layers of TFTs, instead of an amorphous silicon or a polycrystalline silicon. These TFTs are called "oxide semiconductor TFTs". An oxide semiconductor provides a higher mobility than does an amorphous silicon. Therefore, oxide semiconductor TFTs can operate more rapidly than amorphous silicon TFTs. Moreover, an oxide semiconductor film is formed through a simple process as compared to a polycrystalline silicon film, and therefore is applicable to devices which require a large geometric area.

As oxide semiconductor TFTs, there have been proposed TFTs having a bottom-gate structure and having source and drain electrodes provided on an oxide semiconductor layer (top-contact). In this kind of structure, the source and drain electrodes are formed by etching an electrically conductive film that is formed on the oxide semiconductor layer. This structure, in which the surface portion of the oxide semiconductor layer also receives etching, is called a channel etching type. On the other hand, there has also been proposed a structure which involves forming, in an etching step for forming the source and drain electrodes, a dielectric film (etchstop film) above the channel of the oxide semiconductor layer, the dielectric film functioning as an etchstop to prevent the channel from being etched. The structure featuring an etchstop film provided above the channel is called an etching stop type. In the present specification, in abbreviation, a channel etching type TFT will be referred to as a "CE-type TFT", and an etching stop type TFT as an "ES-type TFT".

ES-type TFTs are disclosed in Patent Documents 1 and 2, for example. Patent Document 1 discloses forming an oxide semiconductor layer and an etchstop film through a patterning by using the same mask. The etchstop film has a source aperture and a drain aperture through which the source and drain electrodes are connected to the oxide semiconductor layer. Patent Document 2 discloses forming an interlevel dielectric (etchstop film) so as to cover an oxide semiconductor layer, and making a source aperture and a drain aperture in the etchstop film.

FIG. 8 is a cross-sectional view showing the ES-type TFT which is disclosed in Patent Document 2. The ES-type TFT includes a substrate 1, a gate electrode 3 provided on the substrate 1, a gate dielectric layer 5 covering the gate electrode 3, an oxide semiconductor layer 7 formed on the gate dielectric layer 5, an interlevel dielectric (etchstop film) 90 covering the oxide semiconductor layer 7, and a source electrode 11 and a drain electrode 13 provided on the oxide

2 semiconductor layer 7. The source electrode 11 and the drain electrode 13 are electrically connected to the oxide semiconductor layer 7 respectively through a source aperture 91 and a drain aperture 92, which are made in the etchstop film 90.

CITATION LIST

Patent Literature

[Patent Document 1] Japanese Laid-Open Patent Publication No. 2011-009393
[Patent Document 2] International Publication No. 2009/034953

SUMMARY OF INVENTION

Technical Problem

In recent years, in order to achieve downsizing and capacitance reduction in TFTs, there has been a desire to further decrease the channel length of an oxide semiconductor TFT.

Through the inventors' studies, it has been found that conventional CE-type TFTs have a problem in that their TFT OFF characteristics become more deteriorated as the channel length is made smaller (i.e., as the distance between the source electrode and the drain electrode is made smaller). This appeared to be because, in an etching step for forming the source electrode and the drain electrode, etc., the underlying oxide semiconductor layer is damaged. Upon further studies the inventors have found that deteriorations in the OFF characteristics are caused by the damage which is done to mainly the edge portions of the oxide semiconductor layer. The details will be described later.

For similar reasons, in the ES-type TFT which is disclosed in Patent Document 1, too, for example, the damage which is done to the oxide semiconductor layer during the process may not be sufficiently reduced because the edge portions (including the side face) of the oxide semiconductor layer are exposed from the etchstop film. It is proposed in Patent Document 1 to increase the distance between the channel region and the side face of the oxide semiconductor layer, in order to suppress any fluctuation in the characteristics of the oxide semiconductor TFT that is caused by intrusion of oxygen at the side face of the oxide semiconductor layer, and so on. However, such a construction may not be able to sufficiently reduce the damage which is done to the oxide semiconductor layer. There is also a problem of increased TFT size.

On the other hand, in the ES-type TFT which is disclosed in Patent Document 2, for example, the side face of an oxide semiconductor layer 7 is protected by the etchstop film 90 as well, as shown in FIG. 8; therefore, the side face of the oxide semiconductor layer 7 is restrained from being damaged during the process. However, the source aperture 91 and the drain aperture 92 need to be formed in the etchstop film 90. Such a construction results in a larger channel length than in a CE-type TFT. In a CE-type TFT, the channel length is determined by the distance between the source electrode and the drain electrode. On the other hand, in an ES-type TFT as shown in FIG. 8, the substantial channel length CL is defined by the distance between the source aperture 91 and the drain aperture 92, which is greater than the distance L between the source electrode 11 and the drain electrode 13. This makes it difficult to decrease the channel length CL.

An embodiment of the present invention has been made in view of the above problems, and a main objective thereof is to provide a semiconductor device including a novel oxide semiconductor TFT which not only reduces process damage to the oxide semiconductor layer, but also allows the channel length to be decreased.

Solution to Problem

A semiconductor device according to an embodiment of the present invention is a semiconductor device comprising a thin film transistor, the thin film transistor including: a substrate; a gate electrode provided on the substrate; a gate dielectric layer formed on the gate electrode; an island-shaped oxide semiconductor layer formed on the gate dielectric layer; a protective layer provided so as to cover an upper face and an entire side face of the oxide semiconductor layer, the protective layer having a single opening through which the upper face of the oxide semiconductor layer is only partially exposed; and a source electrode and a drain electrode which are in contact with the oxide semiconductor layer within the single opening.

In one embodiment, at least a part of a channel region of the oxide semiconductor layer is exposed through the single opening.

In one embodiment, a channel length CL of the thin film transistor is equal to an interval L between the source electrode and the drain electrode on the upper face of the oxide semiconductor layer.

In one embodiment, a width of the oxide semiconductor layer along a channel width direction is greater than a width of the opening along the channel width direction, and smaller than widths of the source electrode and the drain electrode along the channel width direction.

In one embodiment, as viewed from a normal direction of a surface of the substrate, the oxide semiconductor layer entirely overlaps the gate electrode.

In one embodiment, as viewed from a normal direction of a surface of the substrate, the single opening is rectangular.

In one embodiment, as viewed from a normal direction of a surface of the substrate, the single opening is elliptical.

In one embodiment, the oxide semiconductor layer comprises at least one metallic element among In, Ga and Zn.

In one embodiment, the oxide semiconductor layer includes a crystalline portion.

A method of producing a semiconductor device according to an embodiment of the present invention comprises: (A) a step of forming a gate electrode on a substrate; (B) a step of forming a gate dielectric layer so as to cover an upper face and a side face of the gate electrode; (C) a step of forming an island-shaped oxide semiconductor layer on the gate dielectric layer; (D) a step of forming a protective layer on the oxide semiconductor layer so as to cover an upper face and a side face of the oxide semiconductor layer; (E) a step of forming a single opening in the protective layer through which the upper face of the oxide semiconductor layer is only partially exposed; and (F) a step of forming a source electrode and a drain electrode which are in contact with the oxide semiconductor layer within the single opening.

Advantageous Effects of Invention

According to an embodiment of the present invention, there is provided a semiconductor device including a novel oxide semiconductor TFT which achieves enhanced reliability by reducing process damage to the oxide semiconductor layer, and which also allows the channel length to be decreased.

DESCRIPTION OF EMBODIMENTS

Figure 1:
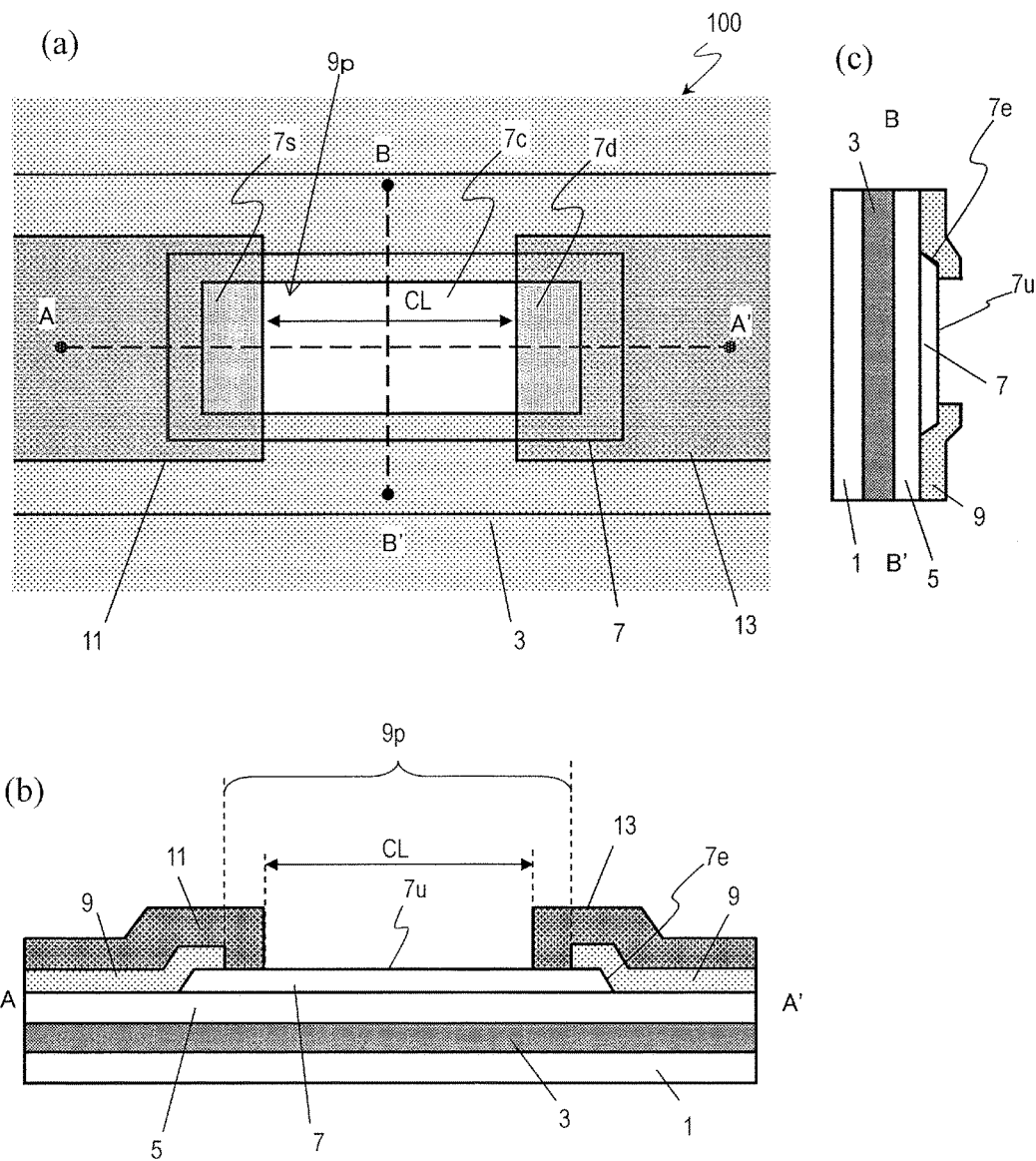
FIG. 1 (a) to (c) are diagrams schematically showing a thin film transistor 100 in a semiconductor device according to an embodiment of the present invention, where (a) is a plan view; and (b) and (c) are cross-sectional views taken along line A-A' and line B-B', respectively, shown in (a).

As described above, the inventors have found that the OFF characteristics of a conventional CE-type TFT are deteriorated as its channel length CL becomes smaller. It has also been found that this problem is due to the damage which is done to mainly the edge portions of the oxide semiconductor layer during an etching step for forming the source electrode and the drain electrode. Specifically, during a fabrication process such as an etching step, oxygen defects occur through an oxidation-reduction reaction in mainly the side face of the oxide semiconductor layer 7. Presumably, this causes the edge portions of the oxide semiconductor layer to have a lowered resistance, thus resulting in a large OFF leak current. Note that "edge portions" include any side face of the oxide semiconductor layer and any portion near the outer edge of an upper face of the oxide semiconductor layer.

On the other hand, it has also been found that, even if anywhere other than the edge portions of the oxide semiconductor layer (e.g., the channel region of the oxide semiconductor layer) is subjected to process damage when forming the source and drain electrodes, the resultant fluctuation in the characteristics of the TFT is sufficiently smaller than that of the case where the edge portions of the oxide semiconductor layer are damaged. Since portions other than the edge portions of the oxide semiconductor layer were protected with a resist during patterning of the oxide semiconductor film, they are less damaged through patterning of the oxide semiconductor film than are the edge portions. If damage happens to be done in any subsequent step (e.g., an etching step for forming the source and drain electrodes), this presumably keeps the changes in the characteristics smaller than in the case where the edge portions are damaged.

Based on the above study results, the inventors have arrived at the finding that, even when the upper face of the oxide semiconductor layer becomes exposed in an etching step, deteriorations in the OFF characteristics of the TFT that are associated with process damage can be sufficiently restrained so long as the side face is protected. This finding has been obtained through studies that are free from the previous common technological knowledge that the channel region of the oxide semiconductor layer needs to be protected.

An embodiment of the present invention, which has been made based on the above finding, provides a semiconductor device including a novel oxide semiconductor TFT which has a protective layer that is able to reduce process damage to the oxide semiconductor layer and decrease the channel length.

Hereinafter, with reference to the drawings, an embodiment of a semiconductor device according to the present invention will be described.

A semiconductor device according to one embodiment of the present invention includes a thin film transistor (oxide semiconductor TFT) having an active layer of oxide semiconductor. The semiconductor device of the present embodiment may include at least one oxide semiconductor TFT, and broadly encompasses substrates, active matrix substrates, various display devices, electronic devices, and the like that include such a TFT(s).

FIG. 1 is a diagram schematically showing a thin film transistor 100 according to the present embodiment. FIG. 1(a) is a plan view of the thin film transistor 100, and FIGS. 1(b) and (c) are cross-sectional views taken along line A-A' and line B-B', respectively, shown in FIG. 1(a).

The thin film transistor 100 includes a substrate 1, a gate electrode 3 which is provided on the substrate 1, a gate dielectric layer 5 covering the gate electrode 3, an island-shaped oxide semiconductor layer 7 formed on the gate dielectric layer 5, a protective layer 9 covering an upper face 7u and an entire side face 7e of the oxide semiconductor layer 7, and a source electrode 11 and a drain electrode 13 which are provided on and electrically connected to the oxide semiconductor layer 7. At least a part of the oxide semiconductor layer 7 overlaps the gate electrode 3 via the gate dielectric layer 5. As shown in the figure, the oxide semiconductor layer 7 may entirely overlap the gate electrode (gate line) 3.

The protective layer 9 has a single opening 9p which only partially exposes the upper face 7u of the oxide semiconductor layer 7. Within the opening 9p, the source electrode 11 and the drain electrode 13 are each in contact with the upper face 7u of the oxide semiconductor layer 7. In the present specification, a region 7s of the oxide semiconductor layer 7 which is in contact with the source electrode 11 is referred to as a "first contact region", whereas a region 7d which is in contact with the drain electrode 13 is referred to as a "second contact region". Moreover, a region 7c of the oxide semiconductor layer 7 which overlaps the gate electrode 3 and which is located between the first contact region and the second contact region is referred to as the "channel region".

The semiconductor device of the present embodiment, because of including the thin film transistor 100 of the above construction, has the following advantages.

Since the side face 7e of the oxide semiconductor layer 7 is protected by the protective layer 9, enhanced reliability can be achieved based on reduced process damage. Moreover, the channel length CL of the thin film transistor 100 is equal to the interval L between the source electrode 11 and the drain electrode 13 on the upper face 7u of the oxide semiconductor layer 7. This makes it possible to reduce the channel length CL down to a minimum value (e.g., 3 μm) that is determined by the precision with which the photoresist is formed. This also permits downsizing and capacitance reduction in the TFT. Hereinafter, this will be described in detail with reference to the drawings.

Figure 2:
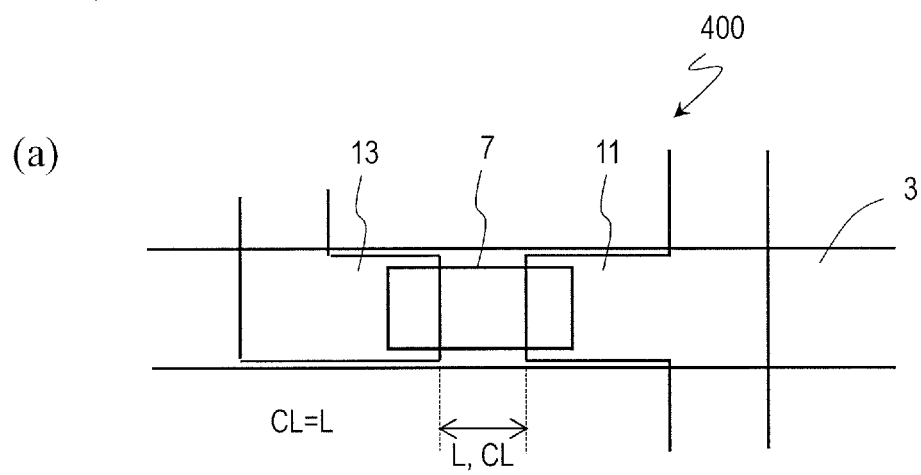
FIGS. 2 (a) and (b) are plan views showing a channel etch type TFT 400 and an etchstop type TFT 500 of Reference Examples, respectively.
Figure 2:
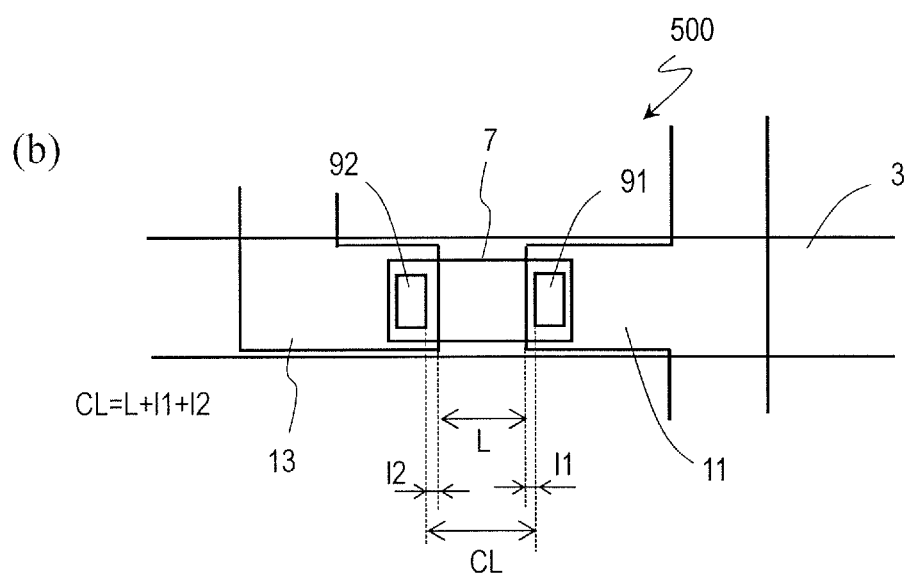

FIGS. 2(a) and (b) are plan views showing TFTs of Reference Examples. FIG. 2(a) shows a CE-type TFT 400 of Reference Example which does not include an etchstop film or a protective layer. FIG. 2(b) shows an ES-type TFT 500 of Reference Example which includes an etchstop film having two openings.

In the CE-type TFT 400 of Reference Example shown in FIG. 2(a), the channel length CL is equal to the distance L between the source and drain electrodes 11 and 13. Therefore, the channel length CL can be made as small as the minimum value of etching width (e.g. 3 μm), which is determined by the precision with which the photoresist is formed in an etching step for isolating the source electrode 11 from the drain electrode 13. However, since the source and drain electrodes 11 and 13 are directly formed on the oxide semiconductor layer 7, mainly the side face of the oxide semiconductor layer 7 may possibly be damaged in the etching step for forming the source and drain electrodes 11 and 13. As a result of this, desired TFT characteristics may not be obtained. In particular, reducing the channel length CL may cause a shift in the threshold voltage.

On the other hand, in the ES-type TFT 500 of Reference Example shown in FIG. 2(b), the source and drain electrodes 11 and 13 are electrically connected to the oxide semiconductor layer 7 respectively through openings 91 and 92 which are made in the etchstop film. In the ES-type TFT 500, the oxide semiconductor layer 7 is protected by the etchstop film, whereby fluctuation in the TFT characteristics that is associated with process damage can be suppressed. However, the two openings 91 and 92 need to be positioned above the oxide semiconductor layer 7, which makes it difficult to miniaturize the TFT 500. Moreover, in the ES-type TFT 500, the distance CL between the opening 91 and the opening 92 defines the channel length. The channel length CL is greater than the distance L between the source electrode 11 and the drain electrode 13. Specifically, the channel length CL is a distance (L+l1+l2) which is obtained by adding, to the distance L, the distance l1 between an edge of the opening 91 and an edge of the source electrode 11 and the distance l2 between an edge of the opening 92 and an edge of the drain electrode 13 as viewed from a normal direction of the substrate 1; thus, the channel length CL is greater than the minimum value of etching width (e.g. 3 μm) which is determined by the precision with which the photoresist is formed. A large channel length CL makes it difficult to increase the ON current. It may also make it difficult to reduce the TFT size or capacitance, thus lowering transmittance for visible light in each pixel.

On the other hand, in the present embodiment, the side face 7e of the oxide semiconductor layer 7 is protected when forming the source and drain electrodes 11 and 13; therefore, similarly to the ES-type TFT 500 of Reference Example, fluctuation in the TFT characteristics that is associated with process damage is suppressed. Moreover, a single, common opening 9p is provided in the protective layer 9 through which to achieve contact of the source and drain electrodes 11 and 13. Therefore, the thin film transistor 100 can be miniaturized as compared to the ES-type TFT 500 of Reference Example (FIG. 2(*b*)), in which openings for achieving contact of the source electrode 11 and achieving contact of the drain electrode 13 are separately provided in the protective layer 9. Moreover, since the distance L between the source electrode 11 and the drain electrode 13 on the oxide semiconductor layer 7 defines the channel length CL, the channel length CL can be made smaller than in the ES-type TFT 500. Although there is no particular limitation as to the channel length CL, it may be e.g. 5 μm or less, and preferably 4 μm or less.

In the example shown in FIG. 1, the opening 9*p* in the protective layer 9 is positioned so as to expose a part of the channel region 7*c* of the oxide semiconductor layer 7; however, positioning of the opening 9*p* is not limited to this. It suffices if the opening 9*p* only partially exposes the upper face 7*u* of the oxide semiconductor layer 7 and is positioned so as not to expose the side face 7*e*. The opening 9*p* may be positioned so as to expose a part or a whole of the channel region 7*c*.

The lengths of the opening 9*p* along the channel width direction and along the channel length direction may be respectively smaller than the lengths of the oxide semiconductor layer 7 along the channel width direction and along the channel length direction. As a result of this, portions of the upper face 7*u* of the oxide semiconductor layer 7 that lie near the side face 7*e* (near the outer edge) can also be protected. Therefore, deteriorations in the OFF characteristics that are associated with damage to the edge portions of the oxide semiconductor layer 7 can be suppressed more effectively.

The widths of the source electrode 11 and the drain electrode 13 along the channel width direction may be greater than the width of the oxide semiconductor layer 7 along the channel width direction. Moreover, as viewed from the normal direction of the surface of the substrate 1, the oxide semiconductor layer 7 may entirely overlap the gate electrode 3. As a result of this, light from the substrate 1 side toward the oxide semiconductor layer 7 can be intercepted by the gate electrode 3, whereby fluctuation in the characteristics due to light impinging on the oxide semiconductor layer 7 can be suppressed.

The oxide semiconductor layer 7 in the present embodiment may contain at least one metallic element among In, Ga and Zn. It may contain a semiconductor of an In—Ga—Zn—O type (hereinafter abbreviated as an "In—Ga—Zn—O type semiconductor"), for example. Herein, the In—Ga—Zn—O type semiconductor is a ternary oxide of In (indium), Ga (gallium), and Zn (zinc). The ratio between In, Ga, and Zn (composition ratio) is not particularly limited, and includes In:Ga:Zn=2:2:1, In:Ga:Zn=1:1:1, In:Ga:Zn=1:1:2, and the like, for example.

A TFT having an In—Ga—Zn—O type semiconductor layer has a high mobility (more than 20 times that of an a-Si TFT) and a low leak current (less than 1/100 of that of an a-Si TFT), and is suitably used as a driving TFT or a pixel TFT.

The In—Ga—Zn—O type semiconductor may be amorphous, or contain a crystalline portion(s) and be crystalline. As a crystalline In—Ga—Zn—O type semiconductor, a crystalline In—Ga—Zn—O type semiconductor whose c axis is oriented generally perpendicular to the layer plane is preferable. The crystal structure of such an In—Ga—Zn—O type semiconductor is disclosed in Japanese Laid-Open Patent Publication No. 2012-134475, for example. The entire disclosure of Japanese Laid-Open Patent Publication No. 2012-134475 is incorporated herein by reference. A TFT having an In—Ga—Zn—O type semiconductor layer has a high mobility (more than 20 times that of an a-Si TFT) and a low leak current (less than 1/100 of that of an a-Si TFT), and is suitably used as a driving TFT or a pixel TFT.

The oxide semiconductor layer 7 may contain other oxide semiconductors instead of an In—Ga—Zn—O type semiconductor. It may contain, for example, a Zn—O type semiconductor (ZnO), an In—Zn—O type semiconductor (IZO (registered trademark)), a Zn—Ti—O type semiconductor (ZTO), a Cd—Ge—O type semiconductor, a Cd—Pb—O type semiconductor, an In—Sn—Zn—O type semiconductor (e.g., In$_2$O$_3$—SnO$_2$—ZnO), an In—Ga—Sn—O type semiconductor, or the like.

The protective layer 9 may be any dielectric layer. As the protective layer 9, an oxide film may be used, for example. When an oxide film is used, if oxygen deficiencies occur in the oxide semiconductor layer 7, it is possible to restore the oxygen deficiencies with the oxygen that is contained in the oxide film; as a result, oxidation defects in the oxide semiconductor layer 7 can be reduced more effectively. As an oxide film, an SiO film or an SiO$_2$ film may be used.

The thickness of the protective layer 9 is preferably not less than 50 nm and 400 nm. When it is not less than 50 nm, in the patterning step of source/drain electrodes, etc., the side face 7*e* of the oxide semiconductor layer 7 can be better protected. On the other hand, if it exceeds 400 nm, the source electrode 11 and the drain electrode 13 will create large stepped portions, possibly causing breaking or the like.

The source and drain electrodes 11 and 13 may be made of the same electrically conductive film. As the material of the electrically conductive film, for example, a film containing a metal such as aluminum (Al), tungsten (W), molybdenum (Mo), tantalum (Ta), copper (Cu), chromium (Cr) or titanium (Ti), an alloy thereof, or a metal nitride thereof may be used as appropriate. The electrically conductive film may be a single-layer film, or a multilayer film. In the case where a multilayer film is used, a high-melting point metal film of e.g. Ti, W or Mo may be used as the lowermost layer that is in contact with the oxide semiconductor layer 7. Ti and Mo are less likely to act (e.g. diffuse) on the oxide semiconductor layer than any other metal (Al, Cu, etc.), and thus deteriorations in the TFT characteristics associated with any metal acting on the oxide semiconductor layer 7 can be suppressed. As an upper layer, an Al film or a Cu film may be used, for example. An Al film or and a Cu film have the advantages of relatively low resistance and good processibility. The multilayer film may have a two-layer structure in which a Ti film and an Al film are provided in this order from the oxide semiconductor layer 7 side, or a three-layer structure in which a Ti film, an Al film, and a Ti film are provided in this order, for example. Moreover, the source electrode 11 may be formed as an integral piece with the source line.

Figure 3:
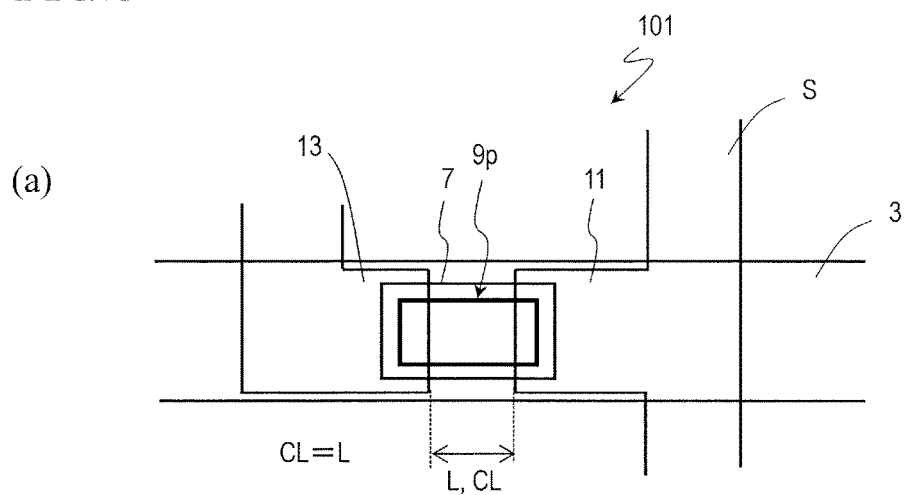
FIGS. 3 (a) and (b) are a plan view and a cross-sectional view along the channel length direction, respectively, illustrating another thin film transistor 101 in a semiconductor device according to an embodiment.
Figure 3:
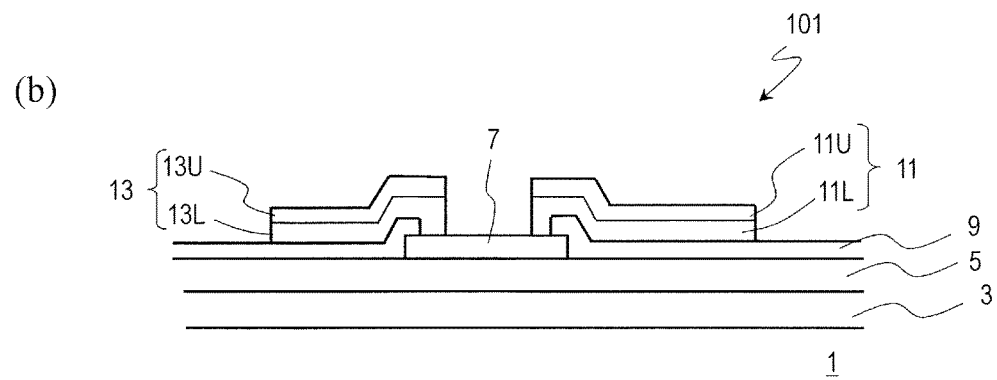

FIGS. 3(*a*) and (*b*) are a plan view and a cross-sectional view, respectively, of another thin film transistor 101 according to the present embodiment. In this example, the source and drain electrodes 11 and 13 are made of the same multilayer film. Moreover, the source electrode 11 is formed as an integral piece with the source line S. The source electrode 11 and the source line S (which may be collectively referred to as a source line) has a two-layer structure with a Ti film as a lower layer 11L of and an Al film as an upper layer 11U, for example. The drain electrode 13 has a two-layer structure with a Ti film as a lower layer 13L and an Al film as an upper layer 13U. Otherwise, the construction is similar to that of the thin film transistor 100 shown in FIG. 1.

Figure 4:
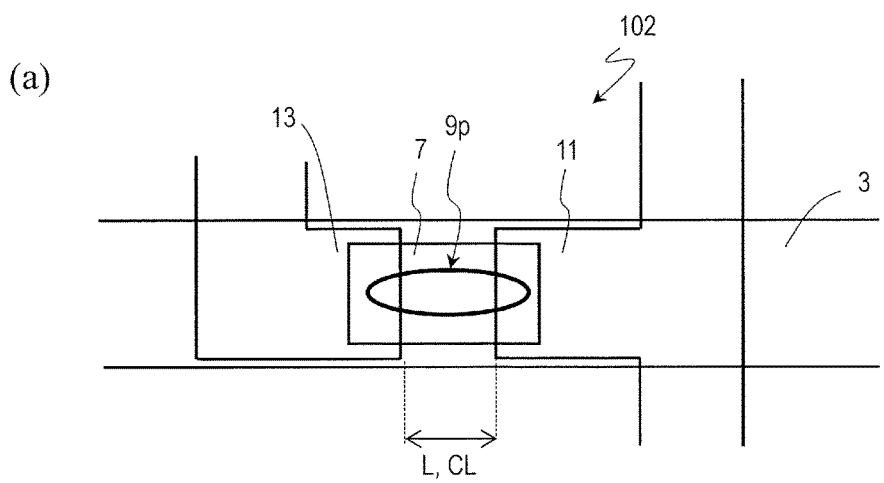
FIGS. 4 (a) and (b) are a plan view and a cross-sectional view along the channel length direction, respectively, illustrating still another thin film transistor 102 in a semiconductor device according to an embodiment.
Figure 4:
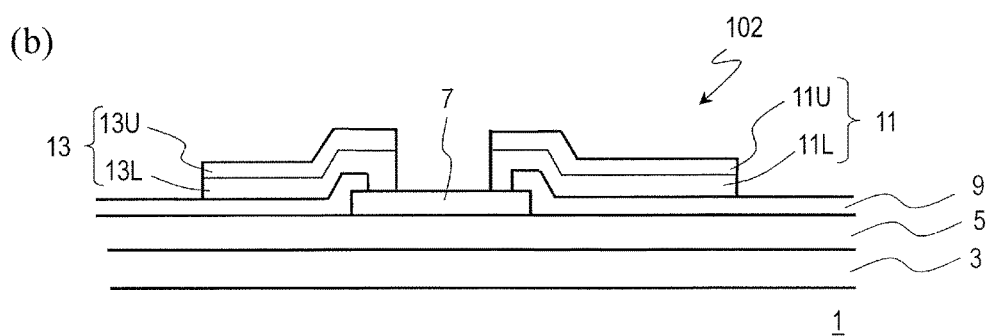
Figure 5:
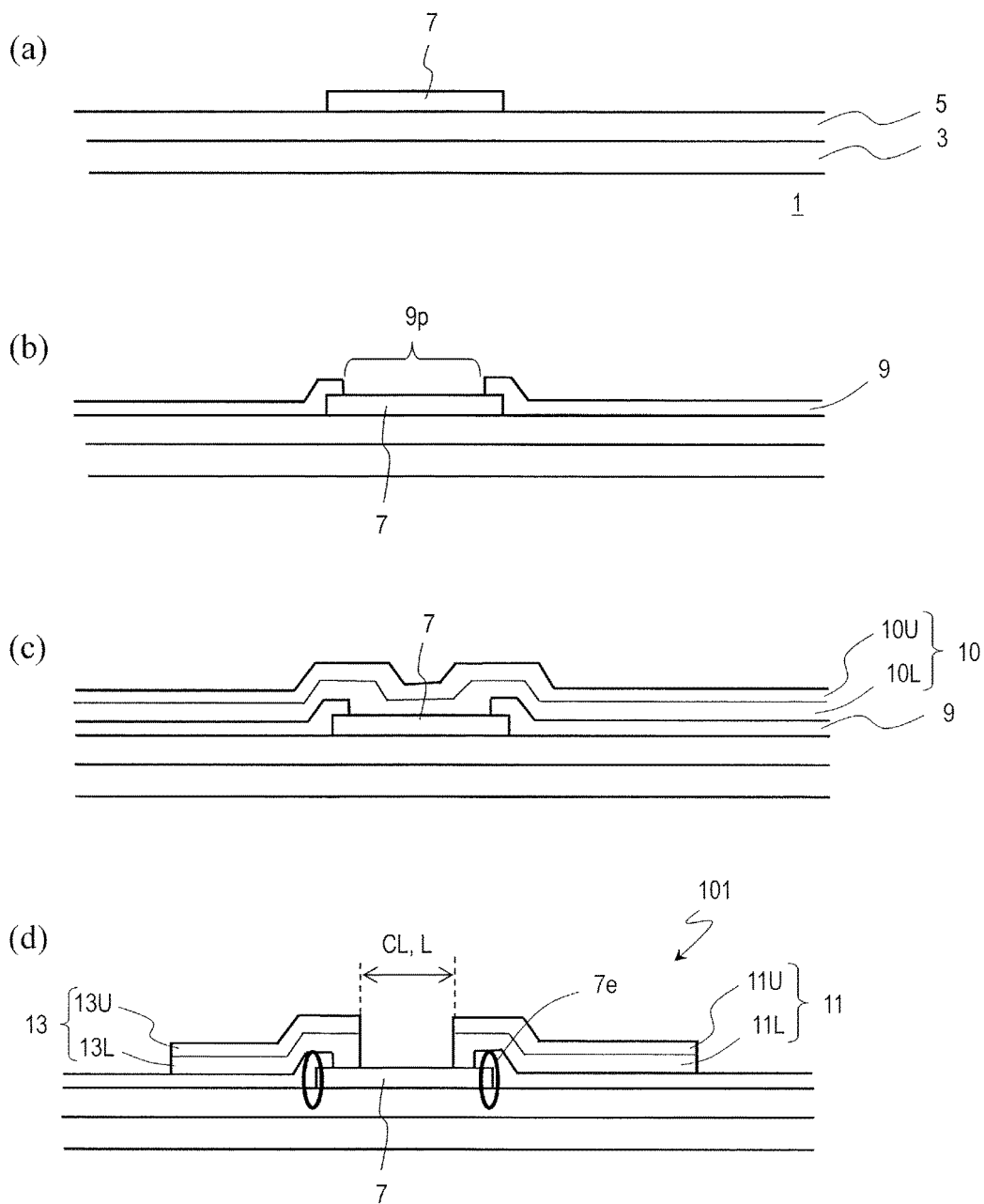
FIG. 5 (a) to (d) are step-by-step cross-sectional views for describing a method of producing the thin film transistor 101.

FIGS. 4(a) and (b) are a plan view and a cross-sectional view, respectively, of still another thin film transistor 102 according to the present embodiment. This example differs from the thin film transistor 101 shown in FIG. 3 in that the shape of the opening 9p in the protective layer 9 is elliptical. So long as the opening 9p only partially exposes the upper face of the oxide semiconductor layer 7 and provides a sufficient area of connection between the exposed portion and the source and drain electrodes 11 and 13, its shape is not limited to rectangular (FIG. 1, FIG. 3) or elliptical (FIG. 4).

Next, with reference to the drawings, an example method of producing the thin film transistor according to the present embodiment will be described. FIGS. 5(a) to (d) are step-by-step cross-sectional views for describing a method of producing the thin film transistor 101. Although a method of producing the thin film transistor 101 shown in FIG. 3 is illustrated as an example herein, the thin film transistors 100 and 102 shown in FIG. 1 and FIG. 4 can also be produced by a similar method.

First, as shown in FIG. 5(a), a gate electrode (gate line) 3 and a gate dielectric layer 5 are provided in this order on a substrate 1 such as a glass substrate. Thereafter, an island-shaped oxide semiconductor layer 7 is formed on the gate dielectric layer 5.

The gate electrode 3 can be formed by, after forming an electrically conductive film on the substrate 1 by a sputtering technique or the like, patterning the electrically conductive film (thickness: e.g. not less than 100 nm and not more than 500 nm) by photolithography. As the electrically conductive film, for example, a film containing a metal such as aluminum (Al), tungsten (W), molybdenum (Mo), tantalum (Ta), chromium (Cr), titanium (Ti) or copper (Cu), or an alloy thereof, may be used as appropriate. As shown in the figure, the gate electrode 3 may be formed as an integral piece with the gate line.

The gate dielectric layer 5 is formed so as to cover the gate electrode 3. The gate dielectric layer 5 can be formed by CVD technique, for example. Herein, as the gate dielectric layer 5, an $SiO_2$ film or a multilayer film of an SiNx film and an $SiO_2$ film is formed. The $SiO_2$ film or the multilayer film has a thickness of not less than 200 nm and not more than 500 nm for example.

The oxide semiconductor layer 7 may be formed in the following manner. First, by using a sputtering technique, an In—Ga—Zn—O type semiconductor film having a thickness of not less than 40 nm and 100 nm, for example, is formed on the gate dielectric layer 5. Thereafter, by photolithography, a resist mask covering a predetermined region of the In—Ga—Zn—O type semiconductor film is formed. Next, portions of the In—Ga—Zn—O type semiconductor film that are not covered by the resist mask are removed by wet etching. Thereafter, the resist mask is removed. In this manner, the island-shaped oxide semiconductor layer 7 is obtained. Instead of an In—Ga—Zn—O type semiconductor film, another oxide semiconductor film may be used to form the oxide semiconductor layer 7.

Next, as shown in FIG. 5(b), a protective layer 9 covering the entire side face and a part of the upper face of the oxide semiconductor layer 7 is formed. In the present embodiment, first, a CVD technique is used to form on the gate dielectric layer 5 and the oxide semiconductor layer 7 an oxide film (e.g., an $SiO_2$ film) with a thickness of not less than 50 nm and 400 nm. Thereafter, by known photolithography, an opening 9p which only partially exposes the upper face of the oxide semiconductor layer 7 is made in the oxide film.

Thus, the protective layer 9 is obtained. Herein, only one opening 9p is provided above one island-shaped oxide semiconductor layer 7.

Next, as shown in FIG. 5(c), by sputtering technique, for example, an electrically conductive film 10 is formed in the opening 9p and on the protective layer 9. Herein, a multilayer film having a Ti film as a lower layer 10L and an Al film as an upper layer 10U is used as the electrically conductive film 10, for example. The thickness of the lower layer 10L is e.g. not less than 20 nm and not more than 150 nm, and the thickness of the upper layer 10U is e.g. not less than 100 nm and not more than 500 nm. Note that the electrically conductive film 10 may be a multilayer film whose lowermost layer is a high-melting point metal film such as a Ti film, and may have a multilayer structure of three or more layers.

Next, as shown in FIG. 5(d), the electrically conductive film 10 is etched, thereby forming a source electrode 11 and a drain electrode 13. The source electrode and the drain electrode 13 are positioned, within the opening 9p, so as to be respectively in contact with regions located on the opposite sides of the region of the oxide semiconductor layer 7 to become a channel region.

As for the etching of the electrically conductive film 10, for example, after a resist mask is formed by photolithography, first, the metal film (which herein is the upper layer 10U) above the Ti film as the lower layer 10L is patterned by wet etching. The etching condition may be set so that the lower layer 10L will not be etched. Next, by dry etching, the Ti film of the lower layer 10L is patterned. In this dry etching step, the side face of the oxide semiconductor layer 7 is protected by the protective layer 9, so that damage which is done to the side face is reduced. Note that, as shown in the figure, not only the side face of the oxide semiconductor layer 7 but also portions of the upper face that lie near the side face may be protected, whereby damage can be better reduced.

Note that the material of the lower layer 10L may have a lower etching rate in etching the upper layer 10U than is the case with the material of the upper layer 10U, whereby only the upper layer 10U can be easily patterned. Moreover, the lower layer 10L may be thinner than the upper layer 10U, whereby the damage which is done to the oxide semiconductor layer 7 in dry etching the lower layer 10L can be further reduced.

Moreover, in the aforementioned dry etching, a part of the surface of the oxide semiconductor layer 7 that is exposed through the opening 9p is also etched (channel etch). Therefore, the portion of the upper face of the oxide semiconductor layer 7 which is exposed through the opening 9p and which is in contact with neither the source electrode 11 nor the drain electrode 13 becomes lower than any other portion.

In this manner, the thin film transistor (oxide semiconductor TFT) 101 is obtained. The channel length CL of the thin film transistor 101 is equal to the interval L between the source electrode 11 and the drain electrode 13 on the oxide semiconductor layer 7. The channel length CL is not more than 5 µm, for example, and preferably not less than 3 µm and not more than 4 µm.

The thin film transistor 101 may be used as switching elements in an active matrix substrate for a liquid crystal display device, for example. In the case where the thin film transistor 101 is used as a switching element, as is described below, a pixel electrode is formed that is electrically connected to the drain electrode 13 of the thin film transistor 101.

FIGS. 6(a) and (b) are a plan view and a cross-sectional view showing an example active matrix substrate which includes the thin film transistors 101.

In the active matrix substrate, an interlevel dielectric layer 15 is formed so as to cover the thin film transistor 101. The interlevel dielectric layer 15 has an opening 15p which reaches the drain electrode 13. A pixel electrode 19 is provided on the interlevel dielectric layer 15. The pixel electrode 19 is in contact with the drain electrode 13 within the opening 15p of the interlevel dielectric layer 15. Herein, the interlevel dielectric layer 15 is a multilayer film having an $SiO_2$ film as a lower layer and an organic dielectric film as an upper layer, for example. The pixel electrode 19 is made of an ITO film (thickness: 50 to 200 nm), for example.

Figure 6:
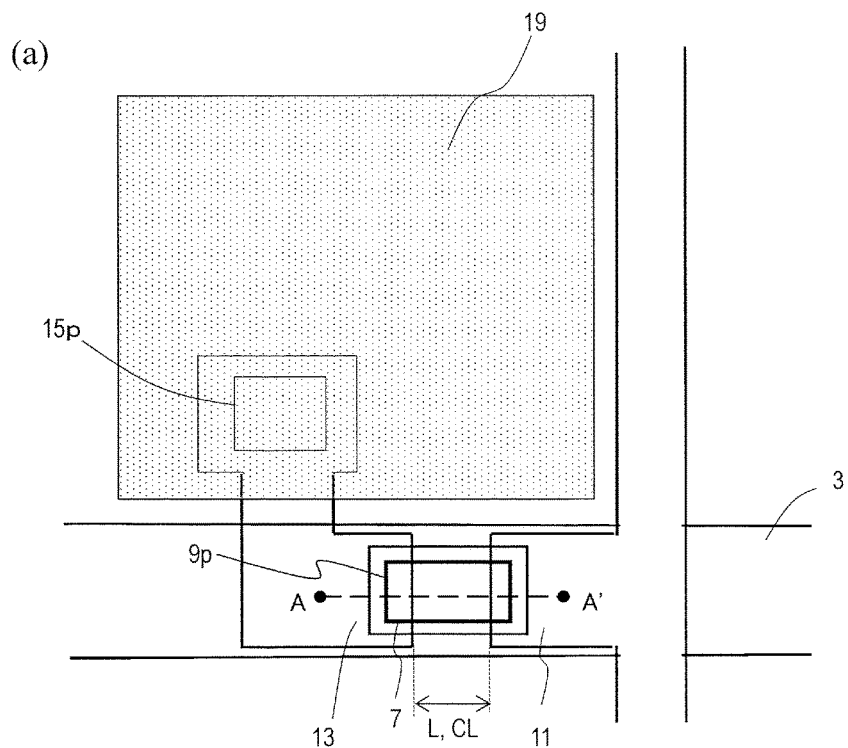
FIGS. 6 (a) and (b) are, respectively, a plan view and a cross-sectional view showing a part of an active matrix substrate including the thin film transistors 101.
Figure 6:
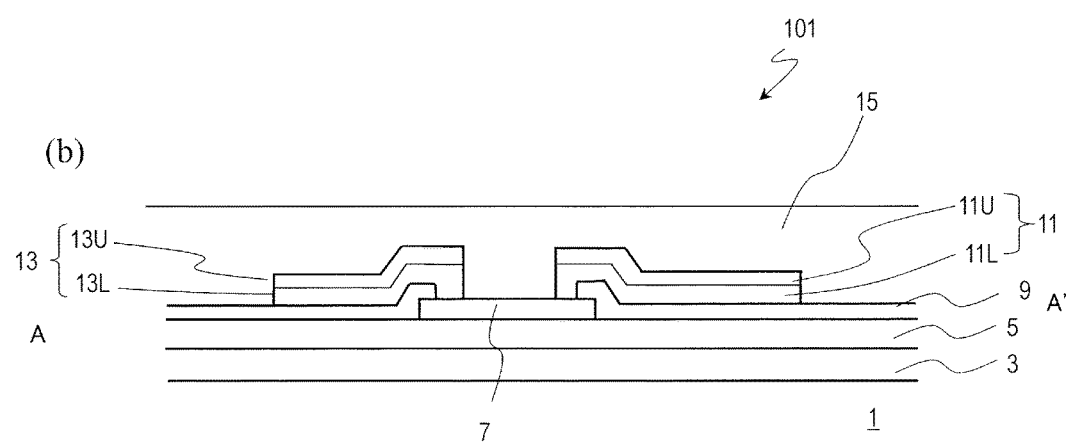

For simplicity, FIG. 6 illustrates one pixel electrode 19 and one thin film transistor 101 each. An active matrix substrate usually includes a plurality of pixels in a two-dimensional array, such that a pixel electrode 19 and a thin film transistor 101 are positioned for each of the plurality of pixels.

With the above method, the side face 7e of the oxide semiconductor layer 7 is protected by the protective layer 9 during the patterning for forming the source electrode 11 and the drain electrode 13 and the formation of the interlevel dielectric layer 15. Therefore, process damage to the side face 7e of the oxide semiconductor layer 7 can be reduced. Thus, lowering of resistance due to oxygen deficiencies occurring in the oxide semiconductor layer 7 to create carriers. As a result, the OFF leak current of the thin film transistor 101 can be reduced, and hysteresis of the TFT characteristics can also be reduced. Moreover, since the interval L between the source and drain electrodes 11 and 13 is equal to the channel length CL, the channel length CL can be made as smalls as the minimum value which takes alignment precision into account. Therefore, downsizing and capacitance reduction in the thin film transistor 101 can be achieved. Moreover, when the thin film transistor 101 is applied to an active matrix substrate, an enhanced pixel aperture ratio can be obtained.

Note that the construction and method of producing of the thin film transistor according to the present embodiment are not limited to the construction and method which have been described above with reference to FIG. 1 and FIG. 3 to FIG. 5. The protective layer 9 may not cover substantially the entire substrate. For example, the protective layer 9 may have an island-shaped pattern with openings 9p in a region in which the TFTs are to be formed on the substrate.

Example and Comparative Example

Oxide semiconductor TFTs of Example and Comparative Example (hereinafter simply referred to as "TFTs") were produced, and changes in their characteristics when their channel length CL was varied were measured; the method and results thereof will be described.

Figure 7:
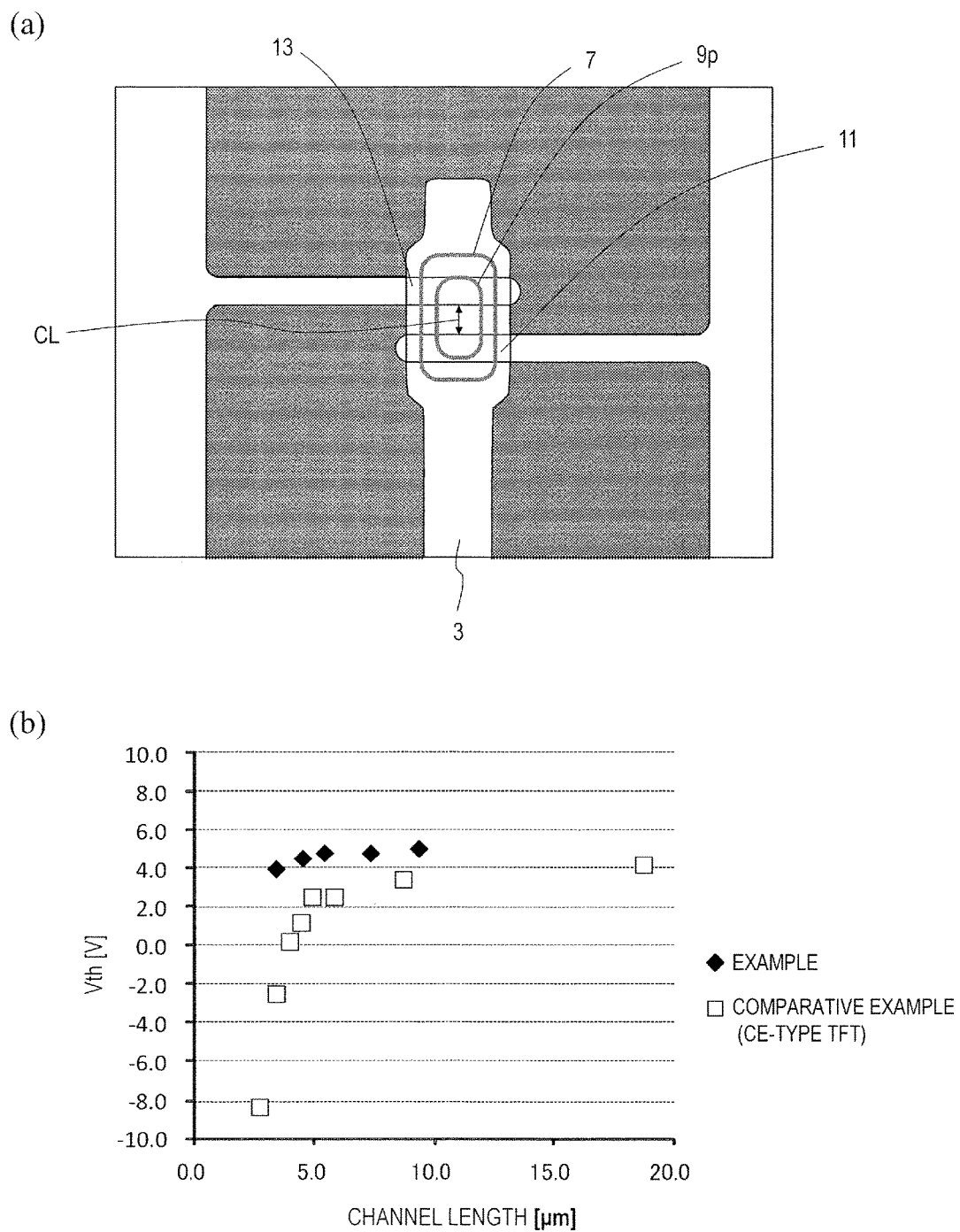
FIG. 7 (a) is a plan view showing a TFT of Example, and (b) is a diagram showing results of measuring threshold voltages of TFTs of Example and Comparative Example.
Figure 8:
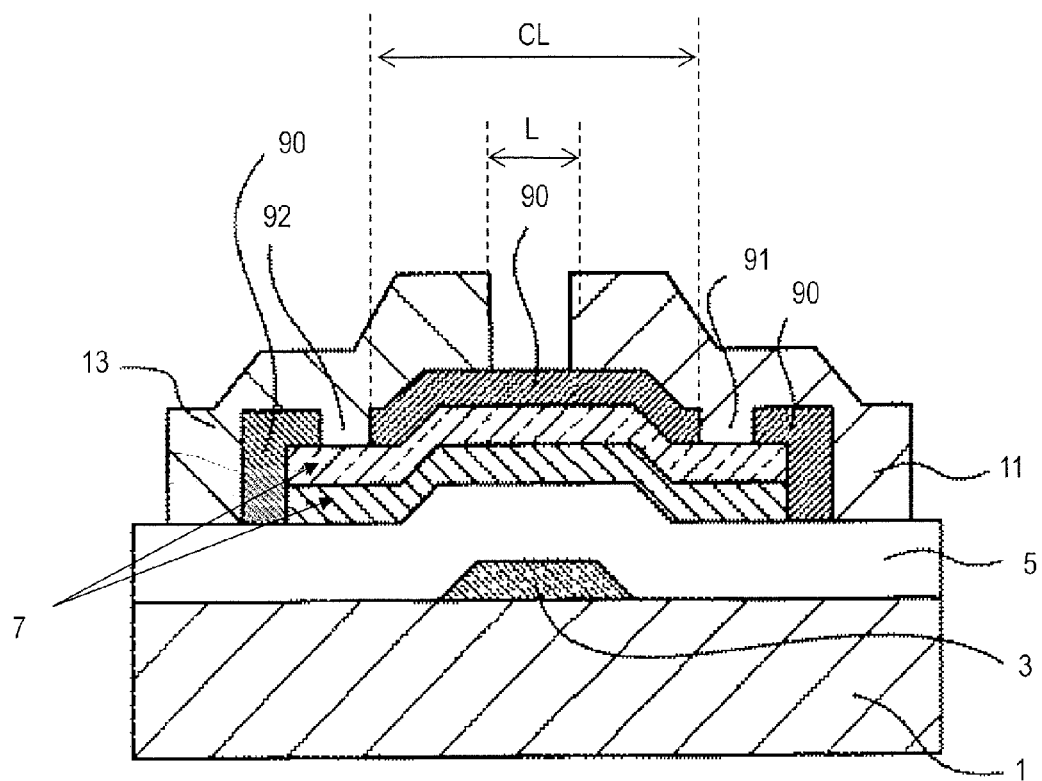
FIG. 8 A cross-sectional view showing an etchstop type TFT which is disclosed in Patent Document 2.

As the Example TFTs, as shown in FIG. 7(a), TFTs were produced which had a protective layer 9 having an opening 9p exposing a part of the upper face of an oxide semiconductor layer 7. The opening 9p had an elliptical shape.

As the Comparative Example TFTs, conventional CE-type oxide semiconductor TFTs with no protective layer 9 were produced. Note that, except for lacking the protective layer 9, the Comparative Example TFTs were identical in construction (material, thickness, size, etc. of each layer) to the Example TFTs.

Based on different channel lengths CL as realized by varying the interval L between the source and drain electrodes 11 and 13 in the Example and Comparative Example TFTs, changes in the threshold voltage Vth were examined. In the measurement, the gate voltage Vgs was −20V to +35V. Results of measurement are shown in FIG. 7(b).

As can be seen from the results shown in FIG. 7(b), in the Comparative Example TFTs, the threshold voltage Vth became lower as the channel length CL was smaller (e.g. less than 5 μm). On the other hand, in the Example TFTs, the threshold voltage Vth remained substantially constant even when the channel length CL was smaller. From these results, it was found that providing the protective layer 9 can reduce the threshold shift that is associated with the channel length CL being made smaller. It was thus confirmed that, with the construction of the present embodiment, the channel length CL can be made as short as in a CE-type TFT, while reducing the threshold shift associated with process damage.

The present embodiment is suitably applicable to an active matrix substrate in which oxide semiconductor TFTs are used. An active matrix substrate may be used in various display devices such as liquid crystal display devices, organic EL display devices, and inorganic EL display devices, as well as electronic devices and the like having a display device. In an active matrix substrate, the thin film transistors 100, 101 and 102 illustrated in FIG. 1, FIG. 3, FIG. 4, etc., are not only used as switching elements to be provided in the respective pixels, but can also be used as circuit elements of peripheral circuitry, e.g., drivers (for monolithic construction). In such cases, the oxide semiconductor TFT of the present embodiment, in which an oxide semiconductor layer with a high mobility (e.g. 10 $cm^2$/Vs or more) is used as an active layer, can also be suitably used as a circuit element.

INDUSTRIAL APPLICABILITY

Embodiments of the present invention are broadly applicable to devices incorporating thin film transistors, such as: circuit boards, e.g., active matrix substrates; display devices, e.g., liquid crystal display devices, organic electroluminescence (EL) display devices, and inorganic electroluminescence display devices; imaging devices, e.g., image sensor devices; and electronic devices, e.g., image input devices and fingerprint reading devices.

REFERENCE SIGNS LIST 1 substrate
3 gate electrode
5 gate dielectric layer
7 oxide semiconductor layer
7s first contact region
7d second contact region
7c channel region
7e side face of oxide semiconductor layer
7u upper face of oxide semiconductor layer
9 protective layer
9p opening
11 source electrode
13 drain electrode
100, 101, 102 thin film transistor

The invention claimed is:
1. A semiconductor device comprising a thin film transistor, the thin film transistor including:
a substrate;
a gate electrode provided on the substrate;
a gate dielectric layer on the gate electrode;

an island-shaped oxide semiconductor layer on the gate dielectric layer;

a protective layer covering an upper face and an entire side face of the oxide semiconductor layer, the protective layer including a single opening through which the upper face of the oxide semiconductor layer is only partially exposed; and a source electrode and a drain electrode that are metal electrodes and in direct contact with both the oxide semiconductor layer within the single opening and a side surface of the single opening.

2. The semiconductor device of claim 1, wherein at least a portion of a channel region of the oxide semiconductor layer is exposed through the single opening.

3. The semiconductor device of claim 1, wherein a channel length of the thin film transistor is equal to an interval between the source electrode and the drain electrode on the upper face of the oxide semiconductor layer.

4. The semiconductor device of claim 1, wherein a width of the oxide semiconductor layer along a channel width direction is greater than a width of the opening along the channel width direction, and smaller than widths of the source electrode and the drain electrode along the channel width direction.

5. The semiconductor device of claim 1, wherein, as viewed from a direction normal to a surface of the substrate, the oxide semiconductor layer entirely overlaps the gate electrode.

6. The semiconductor device of claim 1, wherein, as viewed from a direction normal to a surface of the substrate, the single opening is rectangular.

7. The semiconductor device of claim 1, wherein, as viewed from a direction normal to a surface of the substrate, the single opening is elliptical.

8. The semiconductor device of claim 1, wherein the oxide semiconductor layer includes at least one metallic element among In, Ga, and Zn.

9. The semiconductor device of claim 8, wherein the oxide semiconductor layer includes a crystalline portion.

10. The semiconductor device of claim 1, wherein a portion of the upper face of the oxide semiconductor layer that is exposed through the single opening is not in contact with either the source electrode or the drain electrode, is lower than any other portion of the oxide semiconductor layer, and is covered with an $SiO_2$ film.

11. A method of producing a semiconductor device, comprising:

(A) a step of forming a gate electrode on a substrate;

(B) a step of forming a gate dielectric layer so as to cover an upper face and a side face of the gate electrode;

(C) a step of forming an island-shaped oxide semiconductor layer on the gate dielectric layer;

(D) a step of forming a protective layer on the oxide semiconductor layer so as to cover an upper face and a side face of the oxide semiconductor layer;

(E) a step of forming a single opening in the protective layer through which the upper face of the oxide semiconductor layer is only partially exposed; and (F) a step of forming a source electrode and a drain electrode which are in contact with the oxide semiconductor layer within the single opening including forming a metal film on the protective layer and in the single opening of the protective layer in a manner that the metal film is in direct contact with both the oxide semiconductor layer within the single opening and a side surface of the single opening, and etching the metal film to form the source electrode and the drain electrode.

* * * * *